US007571525B2

(12) United States Patent
Matsuzawa et al.

(10) Patent No.: US 7,571,525 B2
(45) Date of Patent: Aug. 11, 2009

(54) METHOD OF MANUFACTURING LIQUID-JET HEAD AND LIQUID-JET HEAD

(75) Inventors: Akira Matsuzawa, Nagano-ken (JP); Mutsuhiko Ota, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 546 days.

(21) Appl. No.: 11/392,668

(22) Filed: Mar. 30, 2006

(65) Prior Publication Data

US 2006/0250456 A1 Nov. 9, 2006

(30) Foreign Application Priority Data

Mar. 30, 2005 (JP) ............................ 2005-099705
Nov. 18, 2005 (JP) ............................ 2005-334954

(51) Int. Cl.

*H01L 41/22* (2006.01)
*H04R 17/00* (2006.01)
*B21D 53/76* (2006.01)
*G11B 5/127* (2006.01)
*B41J 2/045* (2006.01)

(52) U.S. Cl. ....................... 29/25.35; 29/890.1; 216/27; 347/68; 347/71

(58) Field of Classification Search .............. 347/70–71
See application file for complete search history.

(56) References Cited

U.S. PATENT DOCUMENTS

2005/0262691 A1* 12/2005 Torimoto et al. ........... 29/890.1

FOREIGN PATENT DOCUMENTS

JP 2003-159801 A 6/2003

* cited by examiner

*Primary Examiner*—Matthew Luu
*Assistant Examiner*—Lisa M Solomon
(74) *Attorney, Agent, or Firm*—Sughrue Mion, PLLC

(57) ABSTRACT

Included are the steps of: forming piezoelectric elements on a surface of a passage-forming substrate with a vibration plate in between, and forming a penetrating portion by removing an area in the vibration plate, which area will serve as a communicating portion; forming lead electrodes and sealing up the penetrating portion with an interconnect layer; joining a reservoir forming plate to a surface of a passage-forming substrate; forming liquid passages by wet-etching; forming protection films on inner surfaces of the liquid passages; detaching and removing a protection film on an interconnect layer; and causing a reservoir portion and a communicating portion to communicate with each other by removing a corresponding part of the interconnect layer, and in accordance with the manufacturing method, while the liquid passages are being formed, the communicating portion is formed in a way that an edge of an opening of the vibration plate is located outside an edge of an opening which is close to the penetrating portion, and in a way that at least the edge of the opening of the penetrating portion is thus configured of only any one of the vibration plate and the interconnect layer.

12 Claims, 8 Drawing Sheets

METHOD OF MANUFACTURING LIQUID-JET HEAD AND LIQUID-JET HEAD

The entire disclosure of Japanese Patent Application Nos. 2005-099705 filed Mar. 30, 2005 and 2005-334954 filed Nov. 18, 2005 is expressly incorporated by reference herein.

BACKGROUND OF THE INVENTION

1. Field of the Invention

The present invention relates to a method of manufacturing a liquid-jet head, and to a liquid-jet head. Specifically, the present invention relates to a method of manufacturing an inkjet recording head which ejects ink as a liquid, and to a liquid-jet head.

2. Description of the Prior Art

An inkjet recording head with the following configuration is among inkjet recording heads which are used as liquid-jet heads (see Japanese Patent Laid-open Official Gazette No. 2003-159801, for example). Such an inkjet recording head includes a passage-forming substrate, piezoelectric elements and a reservoir forming plate. In the passage-forming substrate, pressure generating chambers and a communicating portion are formed. The pressure generating chambers communicates respectively with nozzle orifices, and the communicating portion communicates with these pressure generating chambers. The piezoelectric elements are formed over one side of this passage-forming substrate. The reservoir forming plate is joined to a surface of the passage-forming substrate, over which surface the piezoelectric elements are formed. The reservoir forming plate includes a reservoir portion which, along with the communicating portion, constitutes a reservoir. The reservoir is formed by causing the reservoir portion and the communicating portion to communicate with each other via a penetrating portion which penetrates through a vibration plate and a laminated film provided to the top of the vibration plate. Specifically, parts respectively of the vibration plate and the laminated film, which face the communicating portion (reservoir portion), are punched out mechanically. Thus, the reservoir portion and the communicating portion are caused to communicate with each other.

However, when the penetrating portion is formed by means of such a mechanical process, extraneous matter such as scraps is produced, and the extraneous matter goes into passages such as the pressure generating chambers. As a result, the mechanical process brings about a problem that the extraneous matter presents a cause of failure in ejection. Incidentally, if the penetrating portion is caused to undergo, for example, a cleaning process or the like immediately after the penetrating portion is formed, extraneous matter such as scraps can be removed to some extent, but it is still difficult to remove the extraneous matter completely. In addition, the mechanical process of forming the penetrating portion produces cracks and the like around the penetrating portion. This also brings about a problem that the production of cracks causes failure in ejection. Specifically, if ink is filled and ejected from the nozzle orifices while such cracks are left as they are, fragments are detached from cracked parts, these fragments clog up nozzle orifices. As a result, the mechanical process brings about a problem that the clogging causes failure in ejection.

Patent Document, which has been mentioned above, has disclosed a structure for preventing such extraneous matter from being produced by fixing the laminated layer with a coating film made of a resin material for the purpose of solving such problems. Adoption of this structure may check extraneous matter from being produced to some extent, but it is still difficult to completely prevent failure in ejection from stemming from the extraneous matter.

Moreover, in general, protection films made of a material reservoir and the like, which have been formed in the aforementioned manner, for the purpose of prevent the passage-forming substrate and the like from being eroded by the ink. In a case where such protection films are formed in the structure provided with the aforementioned coating film, part of the protection film is also formed on the top of the coating film. In addition, the part of the protection film which has been formed on the top of the coating film made of a resin material is poor at adhesion to a resin material, and accordingly is easy to come off from the coating film. Part of the protection film which has come off from the coating film is likely to clog up nozzles or cause similar problems.

It should be noted that occurrence of such problems is not limited to the method of manufacturing inkjet recording head which eject ink. It goes without saying that such problems also occur in a method of manufacturing other liquid-jet head which eject liquids other than ink.

SUMMARY OF THE INVENTION

With the aforementioned conditions taken into consideration, an object of the present invention is to provide a method of manufacturing a liquid-jet head, and a liquid-jet head, which make it possible to reliably prevent failure in ejection, such as the clogging of nozzles by extraneous matter.

A first aspect of the present invention for the purpose of solving the aforementioned problems is a method of manufacturing a liquid-jet head characterized by including the steps of: forming piezoelectric elements and a penetrating portion; forming lead electrodes and sealing up the penetrating portion; joining a reservoir forming plate to a passage-forming substrate; forming liquid passages; forming protection films; detaching and removing a protection film; causing a reservoir portion and a communicating portion to communicate with each other. In the step of forming piezoelectric elements and a penetrating portion, piezoelectric elements are formed on one interposed in between, and a penetrating portion is formed by removing an area in the vibration plate which will serve as a communicating portion. Each of the piezoelectric elements is configured of a lower electrode, a piezoelectric layer and an upper electrode. In the passage-forming substrate, liquid passages including pressure generating chambers and a communicating portion are formed. The pressure generating chambers communicate respectively with nozzle orifices from which a liquid is ejected, and the communicating portion communicates with the pressure generating chambers. In the step of forming lead electrodes and sealing up the penetrating portion, lead electrodes drawn out respectively from the piezoelectric elements are formed, and the penetrating portion is sealed up with an interconnect layer which is made of the same layer as the lead electrodes are made, but which is separated from the lead electrodes. In the step of joining a reservoir forming plate, a reservoir forming plate is joined to the aforementioned side of the passage-forming substrate. In the reservoir forming plate, a reservoir portion is formed. The reservoir portion communicates with the communicating portion and constitutes a part of a reservoir. In the step of forming liquid passages, the liquid passages are formed by wet-etching the passage-forming substrate from the other side until the vibration plate and the interconnect layer are exposed. In the step of forming protection films, a protection film is formed on the inner surface of each of the liquid passages formed in the passage-forming substrate. The protection films are made of a material having resistance to a liquid. In the step of detaching and removing a protection film, the protection film on the interconnect layer is detached and removed. In the step of causing a reservoir portion and a communicating portion to communicate with each other, part of the interconnect layer is removed by wet-etching the part of the interconnect layer from a side at which the communicating portion is located, and the reservoir portion and the communicating portion are caused to communicate with each other through the removed part. The method of manufacturing a liquid-jet head is also characterized in that, while the liquid passages are being formed, the communicating portion is formed in a way that the edge of the opening, which is close to the vibration plate, is located outside the edge of the opening of the penetrating portion. As a result, at least part of the edge of the opening of the penetrating portion, which part is close to the passage-forming substrate, is configured of only any one of the vibration plate and the interconnect layer.

In the case of the first aspect, while the reservoir portion and the communicating portion are being caused to communicate with each other, no extraneous matter such as scraps is produced. This makes it possible to prevent failure in ejecting, including the clogging of nozzles by the scraps which would otherwise occur. In particular, the present invention makes it possible to satisfactorily detach and remove part of the protection films, which is on the interconnect layer, from a peripheral part of the opening of the penetrating portion. As a result, the present invention makes it possible to prevent production of what is termed as detachment residue, and to accordingly reliably prevent the failure in ejection.

A second aspect of the present invention is the method of manufacturing a liquid-jet head as recited in the first aspect, which characterized in that the penetrating portion is formed with a shape causing the opening to have no angled part throughout the peripheral part.

The second aspect makes it possible to more satisfactorily and reliably detach and remove the part of the protection films, which is on the interconnect layer, along the edge of the opening of the penetrating portion.

A third aspect of the present invention is the method of manufacturing a liquid-jet head as recited in any one of the first and the second aspects, which is characterized in that the penetrating portion is formed in a way that an angle between the inner surface of the penetrating portion and a surface of the vibration plate, which surface is close to the passage-forming substrate, is an acute angle.

The third aspect makes it possible to more satisfactorily and reliably detach and remove the part of the protection films, which is on the interconnect layer, from the edge of the opening of the penetrating portion.

A fourth aspect of the present invention is the method of manufacturing a liquid-jet head as recited in any one of the first to the third aspects, which is characterized in that, in the protection film detaching step, a detachment layer whose internal stress is a compressional stress is formed on the protection film, and thereafter the protection film, which is on the interconnect layer, is detached along with the detachment layer by detaching the detachment layer.

The fourth aspect makes it possible to more easily and reliably remove the part of the protection films, which is on the interconnect layer, by use of the detachment layer.

A fifth aspect of the present invention is the method of manufacturing a liquid-jet head as recited in the fourth aspect, which is characterized in that the internal stress of the detachment layer is not smaller than 80 Mpa.

The fifth aspect makes it possible to more easily and reliably remove the part of the protection films, which is on the interconnect layer, by use of the detachment layer having the predetermined stress.

A sixth aspect of the present invention is the method of manufacturing a liquid-jet head as recited in any one of the fourth and the fifth aspects, which is characterized in that adhesion between the detachment layer and the protection film is stronger than adhesion between the protection film and the interconnect layer.

The sixth aspect makes it possible to satisfactorily adhere the detachment layer and the protection films to each other, and to accordingly remove the part of the protection films, which is on the interconnect layer, along with the detachment layer more easily and reliably.

A seventh aspect of the present invention is the method of manufacturing a liquid-jet head as recited in any one of the fourth to the sixth aspects, which is characterized in that titanium-tungsten (TiW) is used as a material for the detachment layer.

The seventh aspect makes it possible to more easily and reliably remove the part of the protection films, which is on the interconnect layer, along with the detachment layer by forming the detachment layer of the predetermined material.

An eighth aspect of the present invention is the method of manufacturing a liquid-jet head as recited in any one of the first to the seventh aspects, which is characterized by further including a step of removing a part of the interconnect layer in the thickness direction, which part is exposed to the communicating portion, prior to the protection film forming step.

The eighth step makes it possible to more satisfactory and reliably remove the part of the protection films, which is on the interconnect layer, since the adhesion between the interconnect layer and the part of the protection film is made weaker.

A ninth aspect of the present invention is the method of manufacturing a liquid-jet head as recited in the eighth aspect, which is characterized in that the interconnect layer is configured of an adhesion layer and a metal layer formed on the adhesion layer, and in that, in the step of removing the part of the interconnect layer in the thickness direction, a surface of the interconnect layer is lightly etched, and thus at least the adhesion layer is removed.

The ninth aspect makes it possible to remove the adhesion layer and a part of the metal layer, in which the adhesion layer has been diffused, by lightly etching the interconnect layer, and to accordingly make the adhesion between the interconnect layer and the part of the protection films, which is on the interconnect layer, reliably weaker. As a result, the ninth aspect makes it possible to more satisfactorily and reliably remove the part of the protection films, which is on the interconnect layer.

A tenth aspect of the present invention is the method of manufacturing a liquid-jet head as recited in the ninth aspect, which is characterized in that, in the step of causing the reservoir portion and the communicating portion to communicate with each other, only the metal layer in the interconnect layer is removed.

In the case of the tenth aspect, only the metal layer is removed, and the adhesion layer is left as it is. Thereby, the surface of an area of the vibration plate, which area corresponds to the reservoir, is covered with a part of the adhesion layer and a part of the protection film. Accordingly, this makes it possible to reliably prevent extraneous matter, including scraps, from being produced, and to improve resistance of the inner surface of the reservoir to the liquid.

An eleventh aspect of the present invention is the method of manufacturing a liquid-jet head as recited in any one of the first to the tenth aspects, which is characterized in that any one of an oxide and a nitride is used as a material for the protection film.

The eleventh aspect makes it possible to reliably prevent the inner surfaces of the pressure generating chambers and the communicating portion from being eroded by the liquid supplied.

A twelfth aspect of the present invention is the method of manufacturing a liquid-jet head as recited in the eleventh aspect, which is characterized in that tantalum oxide is used as a material for the protection film.

The twelfth aspect makes it possible to reliably prevent the inner surfaces of the pressure generating chambers and the communicating portion from being eroded by the liquid supplied.

A thirteenth aspect of the present invention is a liquid-jet head characterized by including a passage-forming substrate, protection films, piezoelectric elements, lead electrodes, and a reservoir forming plate. In the passage-forming substrate, liquid passages are formed. The liquid passages include pressure generating chambers and a communicating portion. The pressure generating chambers communicate respectively with nozzle orifices from which a liquid is ejected, and the communicating portion communicates with the pressure generating chambers. The protection films are provided respectively to the inner surfaces of the liquid passages, and have resistance to the liquid. The piezoelectric elements are provided to one side of the passage-forming substrate with a vibration plate interposed in between. Each of the piezoelectric elements is configured of a lower electrode, a piezoelectric layer and an upper electrode. The lead electrodes are drawn out respectively from the piezoelectric elements. The reservoir forming plate is joined to a surface of the passage-forming substrate, over which surface the piezoelectric elements are formed. The reservoir forming plate includes a reservoir portion communicating with the communicating portion through a penetrating portion which is provided to the vibration plate. The reservoir portion constitutes a part of reservoir. The liquid-jet head is also characterized by further including an interconnect layer on an area of the vibration plate, which area corresponds to a peripheral part around an opening of the communicating portion. The interconnect layer is made of the same layer as the lead electrodes are made, but is separated from the lead electrodes. The liquid-jet head is characterized in that at least a part of the interconnect layer is provided continuously to the inner surface of the penetrating portion, and in that the surface of an area of the vibration plate, which area corresponds to the reservoir, is covered with the interconnect layer and the protection film.

In the case of the thirteenth aspect, the area of the surface of the vibration plate, which area corresponds to the reservoir, is covered with the interconnect layer and the part of the protection films, and thus the area is not exposed to the inside of the reservoir. Accordingly, this makes it possible to check scraps from being produced while the penetrating portion is being formed, and to improve resistance of the inner surface of the reservoir to the liquid.

A fourteenth aspect of the present invention is the liquid-jet head as recited in the thirteenth aspect, which is characterized in that the interconnect layer is configured of the adhesion layer and the metal layer formed on the adhesion layer, and in that the adhesion layer in the interconnect layer is formed continuously from a peripheral part around the penetrating portion to the inner surface thereof.

In the case of the fourteenth aspect, the adhesion layer with a relatively smaller thickness is formed continuously to the penetrating portion. Accordingly, this makes it possible to more reliably prevent the surface of the vibration plate from being exposed.

DESCRIPTION OF THE PREFERRED EMBODIMENT

Hereinafter, descriptions will be provided for the present invention on the basis of the embodiments.

Embodiment 1

Figure 1:
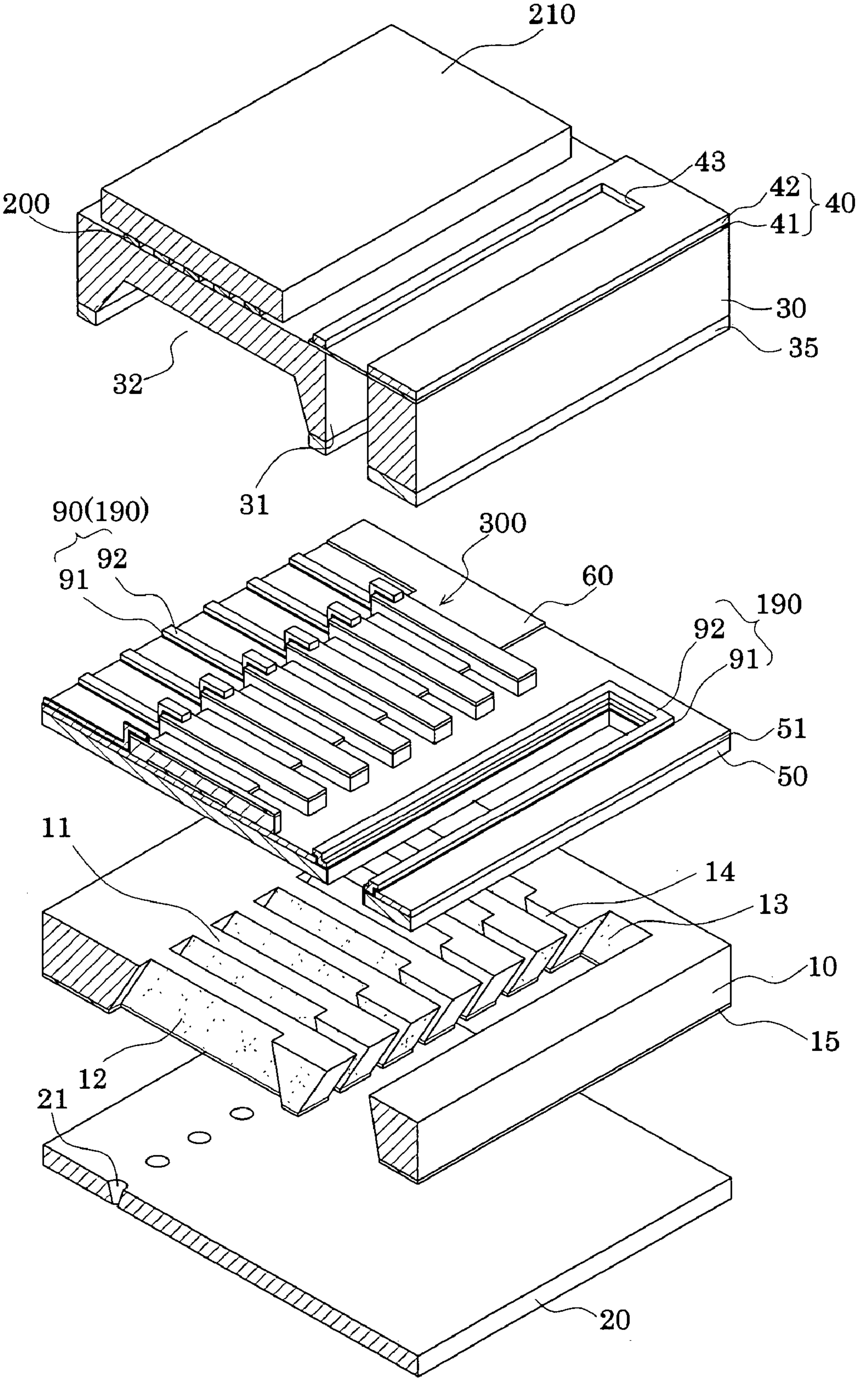
FIG. 1 is an exploded perspective view of a recording head according to Embodiment 1.
Figure 2A:
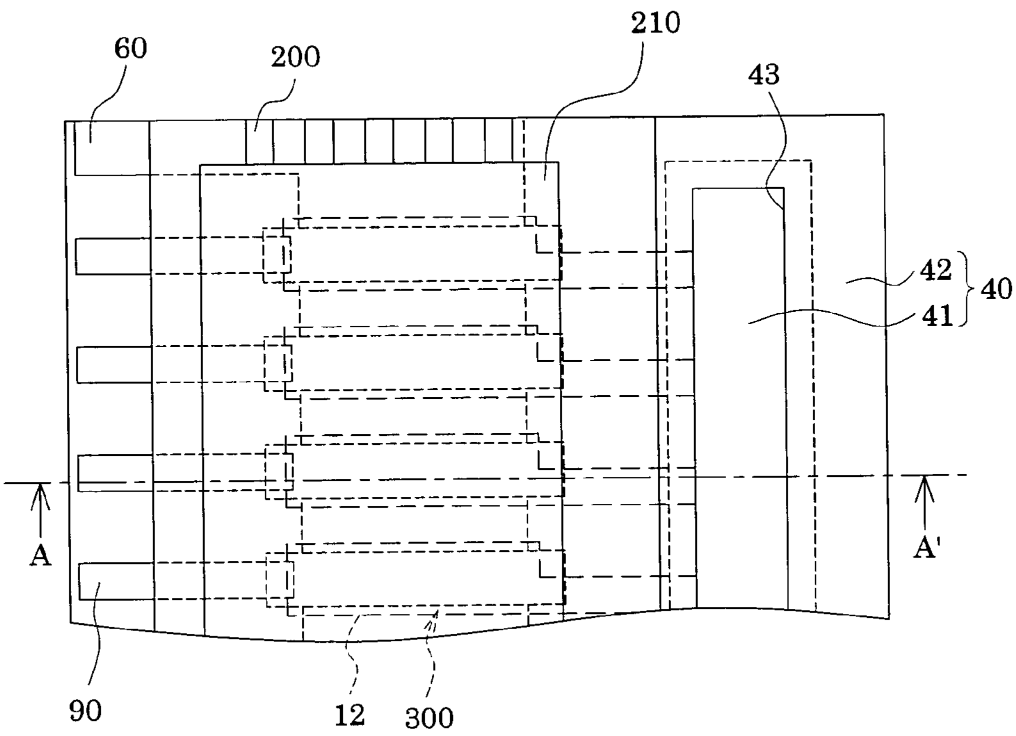
FIGS. 2A and 2B are respectively a plan view of, and a cross-sectional view of, the recording head according to Embodiment 1.
Figure 2B:
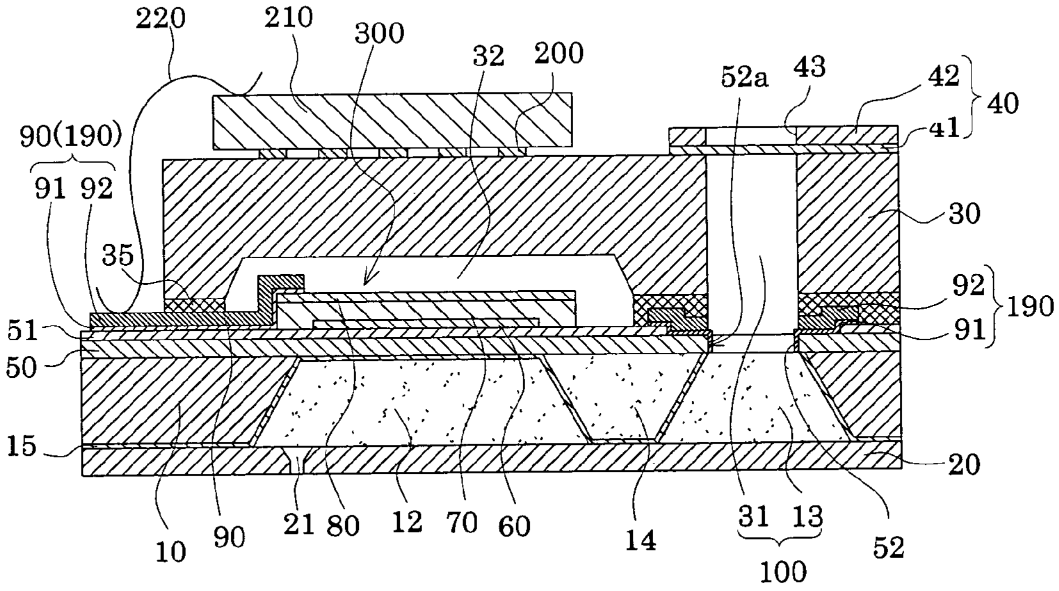

FIG. 1 is an exploded perspective view of an inkjet recording head to be manufactured by means of a manufacturing method according to Embodiment 1 of the present invention. FIGS. 2A and 2B are respectively a plan view of, and a cross-sectional view of, the inkjet recording head shown in FIG. 1. A passage-forming substrate 10 is made of a single crystal silicon substrate in which silicon crystals on the face surface are in the (110) plane direction. As illustrated, an elastic film 50 made of silicon dioxide is formed beforehand on one surface of the passage-forming substrate by thermal oxidation. The elastic film 50 has a thickness of 0.5 to 2 μm.

In the passage-forming substrate 10, a plurality of pressure generating chambers 12 are provided side-by-side in the width direction of the passage-forming substrate 10. In addition, a communicating portion 13 is formed in an area outside of the pressure generating chambers 12 in the longitudinal direction in the passage-forming substrate 10. The communicating portion 13 and the pressure generating chambers 12 communicate with each other respectively through ink supply paths 14 provided to the pressure generating chambers 12. The communicating portion 13 communicates with a reservoir portion 31 in a reservoir forming plate 30, which will be described later. The communicating portion 13 along with the reservoir portion 31 constitutes a reservoir 100 which serves as a common ink chamber for the pressure generating chambers 12. The ink supply paths 14 are formed with widths narrower than those of the pressure generating chambers 12. Thus, the ink supply paths 14 keep passage resistance of ink constant, the ink flowing from the communicating portion 13 to the respective pressure generating chambers 12.

Protection films 15 are provided to the surface of the inner wall of the pressure generating chambers 12, the communicating portion 13 and the ink supply paths 14 of the passage-forming substrate 10. The protection films 15 are made of a material having resistance to ink, and have a thickness of approximately 50 nm. The material is, for example, tantalum oxide ($Ta_2O_2$), such as tantalum pentoxide. Incidentally, the "resistance to ink" means the resistance to etching by alkaline ink. In addition, in the case of this embodiment, one of the protection films 15 is provided to a surface of the passage-forming substrate 10, to which surface the pressure generating chambers 12 and the like are opened. In other words, the protection film 15 is provided to a joint surface of the passage-forming substrate 10, to which a nozzle plate 20 is joined. It is the matter of course that the protection film 15 does not have to be provided such an area, since the ink substantially does not contact the area.

It should be noted that the material for such protection films 15 is not limited to the tantalum oxide. It does not matter whether, for example, zirconia ($ZrO_2$), nickel (Ni), chromium (Cr) or the like is used as a material for the protection films 15 depending on the pH of ink used.

The nozzle plate 20 is fixed to a surface of the passage-forming substrate 10, on which surface the protection film 15 is formed, with an adhesive agent, a thermal adhesive film or the like. In the nozzle plate 20, nozzle orifices 21 are pierced. The nozzle orifices communicate respectively with vicinities of ends of the pressure generating chambers 12, the ends being opposite the ends communicating with the ink supply paths 14. Incidentally, the nozzle plate 20 is made, for example, of glass ceramic, a single crystal silicon substrate, stainless steel or the like.

On the other hand, as described above, the elastic film 50 is formed on a surface of such a passage-forming substrate 10, which surface is opposite the nozzle plate 20. The thickness of the elastic film 50 is, for example, approximately 1.0 μm. On this elastic film 50, an insulation film 51 is formed. The thickness of the insulation film 51 is, for example, approximately 0.4 μm. Moreover, a lower electrode film 60, a piezoelectric layer 70 and an upper electrode film 80 are formed on the insulation film 51 by superposing them over each other on the insulation film 51 by means of a process which will be described later. Thus, a piezoelectric element 300 is configured of the lower electrode film 60, the piezoelectric layer 70 and the upper electrode film 80. The lower electrode film 60 is, for example, approximately 0.2 μm in thickness. The piezoelectric layer 70 is, for example, approximately 1.0 μm in thickness. The upper electrode 80 is, for example, approximately 0.05 μm in thickness. In this respect, a part including the lower electrode film 60, the piezoelectric layer 70 and the upper electrode film 80 is called the "piezoelectric element" 300. In general, the piezoelectric element 300 is configured in the following manner. One of the two electrodes of the piezoelectric element 300 is used as a common electrode, and the other of the two electrodes and the piezoelectric layer 70 are patterned for each of the pressure generating chambers. Furthermore, in this respect, a part configured of one of the two electrodes which has been patterned and its corresponding piezoelectric layer 70 causes piezoelectric strain when a voltage is applied to the two electrodes. This part is called a piezoelectric active portion. In the case of this embodiment, the lower electrode 60 film is used as the common electrode of the piezoelectric elements 300, and the upper electrode films 80 are used as individual electrodes respectively of the piezoelectric elements 300. However, it does not matter the use is the other way round for the convenience of arrangement of a drive circuit or interconnects. In both cases, the piezoelectric active portion is formed for each of the pressure generating chambers. As well, in this respect, a combination of the piezoelectric element 300 and a vibration plate, which provides displacement due to drive of the piezoelectric element 300, is called a piezoelectric actuator.

Lead electrodes 90 are connected respectively to the upper electrode films 80 of the piezoelectric elements 300. Each of the lead electrodes 90 is configured of an interconnect layer 190 made of an adhesion layer 91 and a metal layer. A voltage is selectively applied to each of the piezoelectric elements 300 through its corresponding lead electrode 90. In addition, the interconnect layer 190 is present in an area of the vibration plate, which area corresponds to the peripheral part around an opening of the communicating portion 13. In other words, the interconnect layer 190 is present in areas respectively of the elastic film 50 and the insulation film 51, which areas correspond to the peripheral part around an opening of the communicating portion 13. This interconnect layer 190 is made of the adhesion layer 91 and the metal material 92, but is separated from the lead electrodes 90. The detail of this will be described later.

In addition, the reservoir forming plate 30 is joined to a surface of the passage-forming substrate 10, over which surface the piezoelectric elements 300 are formed. The reservoir forming plate 30 includes the reservoir portion 31 constituting at least a part of the reservoir 100. In the case of this embodiment, the passage-forming substrate 10 and the reservoir forming plate 30 are joined to each other by use of an adhesive agent 35. The reservoir portion 31 in the reservoir forming plate 30 communicates with the communicating portion 13 through a penetrating portion 52 provided to the elastic film 50 and the insulation film 51. The reservoir 100 is formed of the reservoir portion 31 and the communicating portion 13. Incidentally, at least a part of the interconnect layer 190, for example, the adhesion layer 91 in the case of this embodiment, is formed continuously from the peripheral part of the opening of the communicating portion 13 to the inner peripheral surface of 52*a* of the penetrating portion 52. The details of this will be described later.

A piezoelectric element holding portion 32 is provided to an area of the reservoir forming plate 30, which area faces the piezoelectric elements 300. Since the piezoelectric elements 300 are formed inside this piezoelectric element holding portion 32, the piezoelectric elements 300 are protected while hardly susceptible to influence of the external environment. Incidentally, it does not matter whether or not the piezoelectric element holding portion 32 is sealed up. As a material for such a reservoir forming plate 30, for example, glass, a ceramic material, a metal, resin and the like are enumerated. It is desirable that the reservoir forming plate 30 be formed of a material having a thermal expansion coefficient almost equal to that of the material of the passage-forming substrate 10. In the case of this embodiment, the reservoir forming plate 30 is formed of the single crystal silicon substrate which is the same as the material of the passage-forming substrate 10.

Moreover, the top of the reservoir forming plate 30 is provided with connecting wirings 200 each formed with a predetermined pattern. A driver IC 210 for driving the piezoelectric elements 300 is packaged on the connecting wirings 200. In addition, the extremities of the lead electrodes 90 drawn out from the respective piezoelectric elements 300 to the outside of the piezoelectric element holding portion 32 are electrically connected with the driver IC 210 through corresponding driver wirings 220.

Furthermore, a compliance plate 40 configured of a sealing film 41 and the fixing plate 42 is joined to an area of the reservoir forming plate 30, which area corresponds to the reservoir portion 31. The sealing film 41 is made of a flexible material with less rigidity (for example, a polyphenylene sulfide (PPS) film with a thickness of 6 μm). One side of the reservoir portion 31 is sealed up by this sealing film 41. Additionally, the fixing plate 42 is formed of a hard material, such as a metal (for example, stainless steel (SUS) or the like with a thickness of 30 μm). An area of this fixing plate 42, which area faces the reservoir 100 is completely removed from the fixing plate 42, and the removed area is an opening portion 43. As a result, one side of the reservoir 100 is sealed up only by the sealing film 41, which is flexible.

Such an inkjet recording head according to this embodiment takes in ink from external ink supply means, which is not illustrated. After the interior ranging from the reservoir 100 to the nozzle orifices 21 is filled with the ink, voltage is applied between the lower electrode film 60 and each of the upper electrode films 80 corresponding respectively to the pressure generating chambers 12 in accordance with recording signals from the driver IC 210. Thereby, the piezoelectric layers 300 and the vibration plate are distorted with flexure. Thus, these distortions increase pressure in the pressure generating chambers 12, and ink is ejected from the nozzle orifices 21.

Hereinafter, descriptions will be provided for a method of manufacturing such an inkjet recording head with reference to FIGS. 3 to 7. Incidentally, FIGS. 3 to 7 are cross-sectional views of the pressure generating chambers in the longitudinal direction, which show the method of manufacturing the inkjet recording head.

Figure 3A:
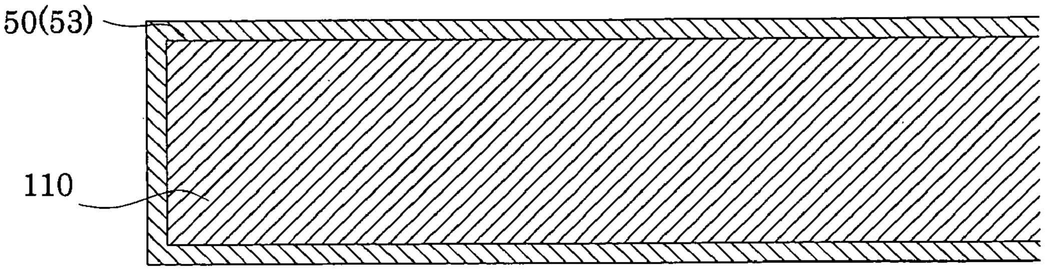
FIGS. 3A to 3D are cross-sectional views respectively showing steps of manufacturing the recording head according to Embodiment 1.

First of all, as shown in FIG. 3A, a wafer for a passage-forming substrate 110, which is a silicon wafer, is thermally oxidized in a diffusion furnace at approximately 1100° C. A silicon dioxide film 53 constituting the elastic film 50 is formed on the surfaces of the wafer for a passage-forming substrate 110. Incidentally, in the case of this embodiment, a silicon wafer which is relatively as large as 625 μm in thickness, and which has higher rigidity, is used as the wafer for a passage-forming substrate 110.

Figure 3B:
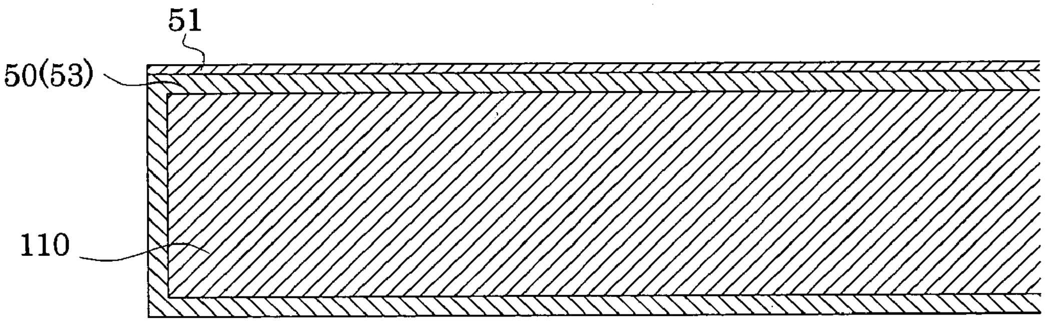

Subsequently, as shown in FIG. 3B, the insulation film 51 made of zirconia is formed on the elastic film 50 (silicon dioxide film 53) Specifically, the zirconium (Zr) layer is formed on the elastic film 50 (silicon dioxide film 53), for example, by a sputtering method or the like. Thereafter, this zirconium layer is thermally oxidized, for example, in the diffusion furnace at a temperature of 500 to 1200° C. Thereby, the insulation film 51 made of zirconia ($ZrO_2$) is formed.

Figure 3C:
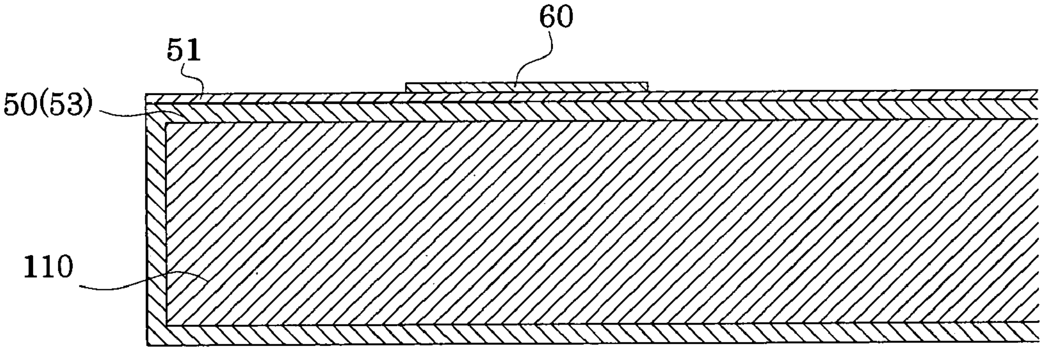
Figure 3D:
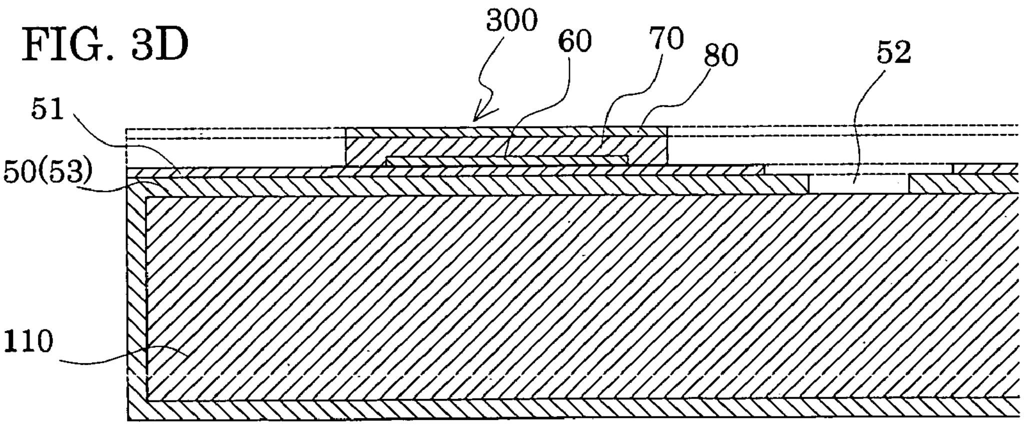

Thereafter, as shown in FIG. 3C, the lower electrode film 60 is formed, for example, by superposing platinum and iridium over the insulation film 51. Subsequently; this lower electrode film 60 is patterned into predetermined shapes. Then, as shown in FIG. 3D, the piezoelectric layer 70 and the upper electrode film 80 are formed on the entire surface of the wafer for a passage-forming substrate 110. The piezoelectric layer 70 is made, for example, of lead-zirconate-tintanate (PZT) or the like. The upper electrode film 80 is made, for example, of iridium. Thereafter, the piezoelectric layer 70 and the upper electrode film 80 are patterned in each of the areas, which respectively face the pressure generating chambers 12. Thereby the piezoelectric elements 300 are formed. In addition, after the piezoelectric elements 300 are formed, the insulation film 51 and the elastic film 50 are patterned. Thereby, the penetrating portion 52 is formed in an area in the wafer for a passage-forming substrate 110, in which area the communicating portion (not illustrated) is going to be formed. The penetrating portion 52 penetrates through the insulation film 51 and the elastic film 50, and exposes apart of the surface of the wafer for a passage-forming substrate 110.

It should be noted that a ferroelectric-piezoelectric material, a relaxor ferroelectric or the like is used as a material for the pieozoelectric layers 70 respectively constituting the piezoelectric elements 300. Examples of the ferroelectric-piezoelectric material include lead-zirconate-titanate (PZT). The relaxor ferroelectric is obtained by adding a metal, such as niobium, nickel, magnesium, bismuth, yttrium, to the ferroelectric-piezoelectric material. The composition of the material for the piezoelectric layers 70 may be selected-depending on the necessity with properties of the piezoelectric elements 300 and their intended use taken into consideration. Examples of the composition includes $PbTiO_3$(PT), $PbZrO_3$ (PZ), $Pb(ZXr_xTi_{1-x})O_3$(PZT), $Pb(Mg_{1/3}Nb_{2/3})O_3$—$PbTiO_3$ (PMN-PT), $Pb(Zn_{1/3}Nb_{2/3})O_3$—$PbTiO_3$(PZN-PT), $Pb(Ni_{1/3}Nb_{2/3})O_3$—$PbTiO_3$(PNN-PT), $Pb(In_{1/2}Nb_{1/2})O_3$—$PbTiO_3$ (PIN-PT), $Pb(Sc_{1/2}Ta_{1/2})O_3$—$PbTiO_3$(PST-PT), $Pb(Sc_{1/2}Nb_{1/2})O_3$—$PbTiO_3$(PSN-PT), BiScO3-$PbTiO_3$(BS-PT) and $BiYbO_3$—$PbTiO_3$(BY-PT).

In addition, no specific restriction is imposed on the method of forming the piezoelectric layers 70. In the case of this embodiment, for example, the piezoelectric layers 70 are formed by use of what is termed as the sol-gel method. In accordance with the sol-gel method, what is termed as sol is obtained by dissolving and dispersing a metal-organic substance in a catalytic agent. This sol is turned into gel by application and drying. Then, the gel is baked at a high temperature. Thereby, the piezoelectric layers 70 made of a metal oxide are obtained.

Figure 4A:
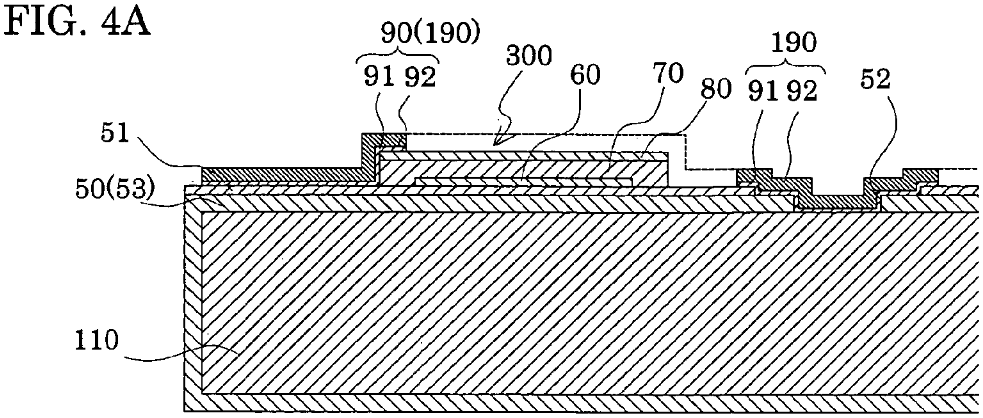
FIGS. 4A to 4C are cross-sectional views respectively showing steps of manufacturing the recording head according to Embodiment 1.

Subsequently, as shown in FIG. 4A, the lead electrodes 90 are formed. Specifically, first of all, the metal layer 92 is formed on the entire surface of the wafer for a passage-forming substrate 100 with the adhesion layer 91 interposed in between. Thus, the interconnect layer 190 configured of the adhesion layer 91 and the metal layer 92 is formed. Then, a mask pattern (not illustrated) made, for example, of a resist or the like is formed on the interconnect layer 190. Thereafter, the metal layer 92 and the adhesion layer 91 are patterned respectively for the piezoelectric elements 300 by use of this mask pattern. Thereby the lead electrodes 90 are formed. Moreover, while the metal layer 92 and the adhesion layer 91 are being patterned respectively for the piezoelectric elements 300 by use of this mask pattern, the interconnect layer 190 which is separated from the lead electrodes 90 is left, as it is, on an area facing the penetrating portion 52. The penetrating portion 52 is sealed up by this interconnect layer 190.

In this respect, no specific restriction is imposed on the material for the metal layer 92, as long as the material for the metal layer 92 is a material with a relatively high conductivity. For example, gold (Au), platinum (Pt), aluminum (Al) and copper (Cu) can be enumerated as the material. In the case of this embodiment, gold (Au) is used as the material. Furthermore, any material may be used as the material for the adhesion layer 91, as long as the material can secure the adhesive quality of the adhesion layer 92. Specifically, titanium (Ti), a compound containing titanium and tungsten (TiW), nickel (Ni), chromium (Cr) and a compound of nickel and chromium (NiCr) can be enumerated as the material for the adhesion layer 91. In the case of this embodiment, the compound containing titanium and tungsten (TiW) is used as the material for the adhesion layer 91.

Figure 4B:
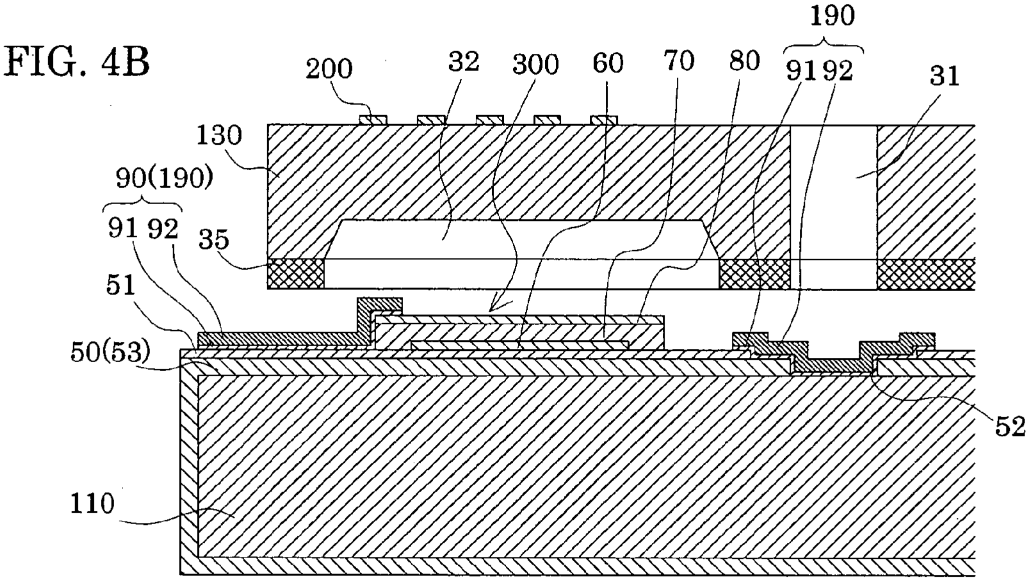

Thereafter, as shown in FIG. 4B, a wafer for a reservoir forming plate 130 is adhered to the top of the wafer for a passage-forming substrate 110 by use of the adhesive agent 35. At this point, the reservoir portion 31, the piezoelectric element holding portion 32 and the like are formed beforehand in this wafer for a reservoir forming plate 130. In addition, the aforementioned connecting wirings 200 are formed beforehand on the top of the wafer for a reservoir forming plate 130. Incidentally, the wafer for a reservoir forming plate 130 is a silicon wafer, for example, with a thickness of approximately 400 μm. The joining of the wafer for a reservoir forming plate 130 to the wafer for a passage-forming substrate 110 increases the rigidity of the wafer for a passage-forming substrate 110 to a remarkable extent.

Figure 4C:
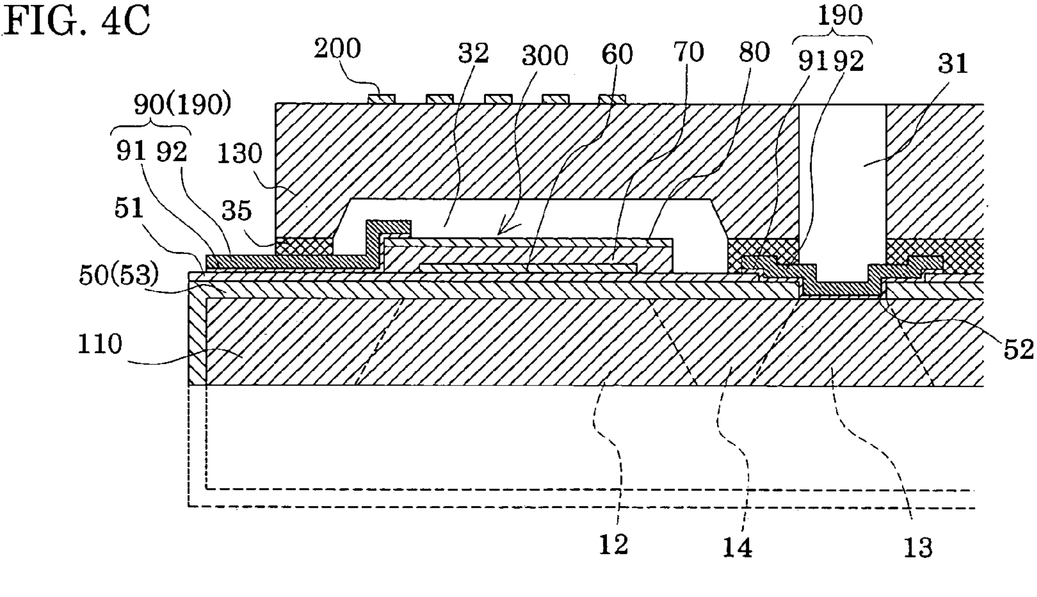
Figure 5A:
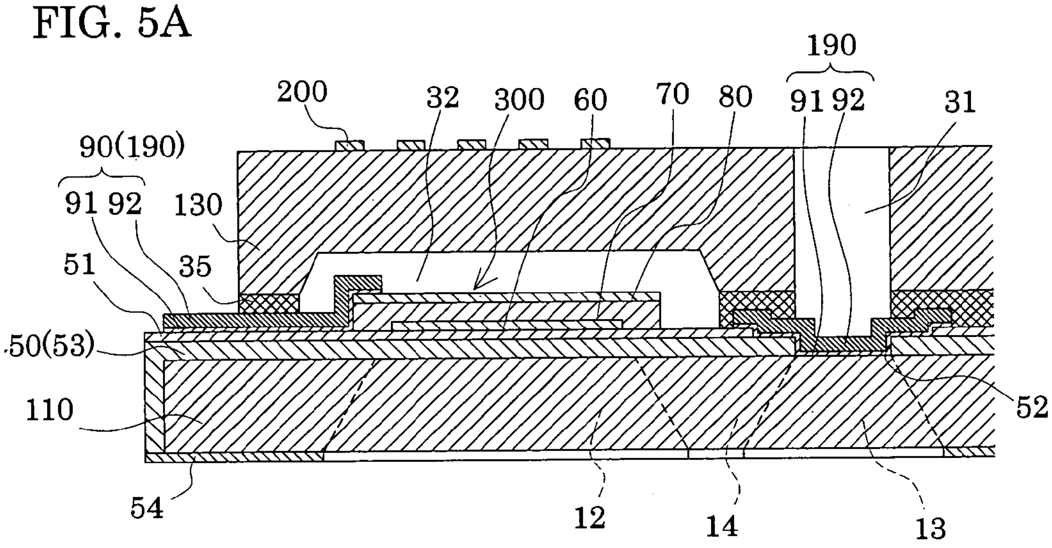
FIGS. 5A and 5B are cross-sectional views respectively showing steps of manufacturing the recording head according to Embodiment 1.
Figure 5B:
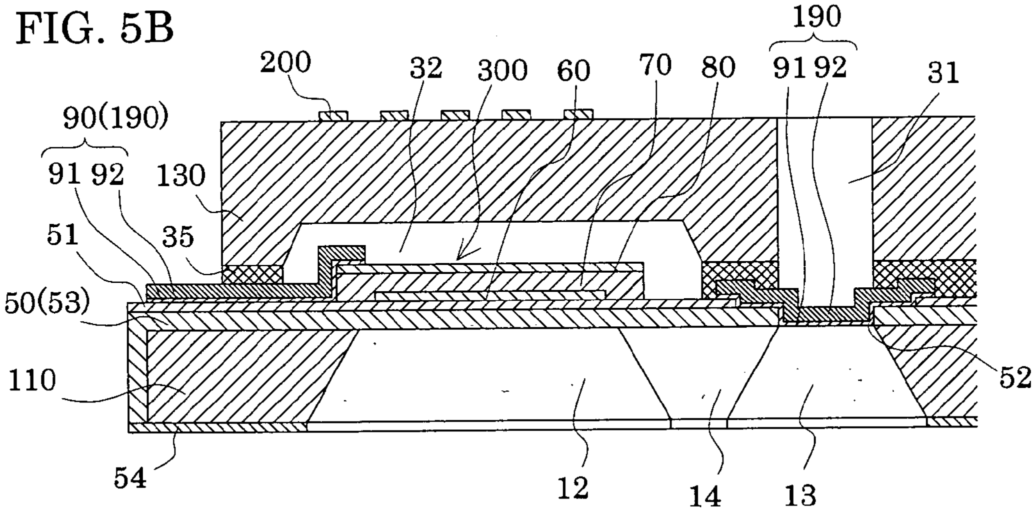

Next, as shown in FIG. 4C, the wafer for a passage-forming substrate 110 is polished to a certain thickness. Thereafter, the wafer for a passage-forming substrate 110 is wet-etched by use of fluoro-nitric acid, and thereby is formed to a predetermined thickness. In the case of this embodiment, for example, the wafer for a passage-forming substrate 110 is processed by means of polishing and wet-etching in order that the wafer for a passage-forming substrate 110 can be approximately 70 cm in thickness. Subsequently, as shown in FIG. 5A, a mask film 54 made, for example, of silicon nitride (SiN) is newly formed on the resultant wafer for a passage-forming substrate 110. Then, the resultant wafer for a passage-forming substrate 110 is patterned into predetermined shapes. Thereafter, as shown in FIG. 5B, the wafer for a passage-forming substrate 110 is anisotropically etched (wet-etched) by use of the mask film 54. Thereby, the liquid passages are formed in the wafer for a passage-forming substrate 110. In the case of this embodiment, the liquid passages include the pressure generating chambers 12, the communicating portion 13 and the ink supply paths 14. Specifically, the wafer for a passage-forming substrate 110 is etched by use of an etchant, such as an aqueous solution of potassium hydrate, until the elastic film 50 and the adhesion layer 91 (the metal layer 92) come to be exposed. Thereby, the pressure generating chambers 12, the communicating portion 13 and the ink supply paths 14 are formed at a time. Incidentally, the communicating portion 13 is formed in a way that the edge of an opening of the communicating portion 13, which opening is close to the vibration plate (the elastic film 50), can be located outside the edge of the opening of the penetrating portion 52. In other words, the penetrating portion 13 is formed in a way that the opening, which is close to the vibration plate, is larger than that of the penetrating portion 52. The detail of this will be described later.

Moreover, while the penetrating portion 13 and the like are being formed in this manner, the etchant does not flow into the wafer for a reservoir forming plate 130 though the penetrating portion 52. That is because the penetrating portion 52 is sealed up by the interconnect layer 190 configured of the adhesion layer 91 and the metal layer 92. Accordingly, the etchant is not adhered to the connecting wirings 200 provided to the top of the wafer for a reservoir forming plate 130. This makes it possible to prevent defects, such as breakage of the connecting wirings 200, from being caused. In addition, it is unlikely that the etchant may get into the reservoir portion 31, and that the wafer for a reservoir forming plate 130 may be accordingly etched by the etchant which would otherwise get into the wafer for a reservoir forming plate 130.

It should be noted that, while such pressure generating chambers 12 and the like are being formed, a surface of the wafer for a reservoir forming plate 130, which surface is opposite the surface to which the wafer for a passage-forming substrate 110 is fixed, may be sealed up with a sealing film. The sealing film is made of a material having resistance to alkali. Examples of the material include PPS (polyphenylene sulfide), PPTA (poly-paraphenylene terephthalamide). Accordingly, this makes it possible to more reliably prevent defects, such as breakages of the wirings provided to the top of the wafer for a reservoir forming plate 130.

Figure 6A:
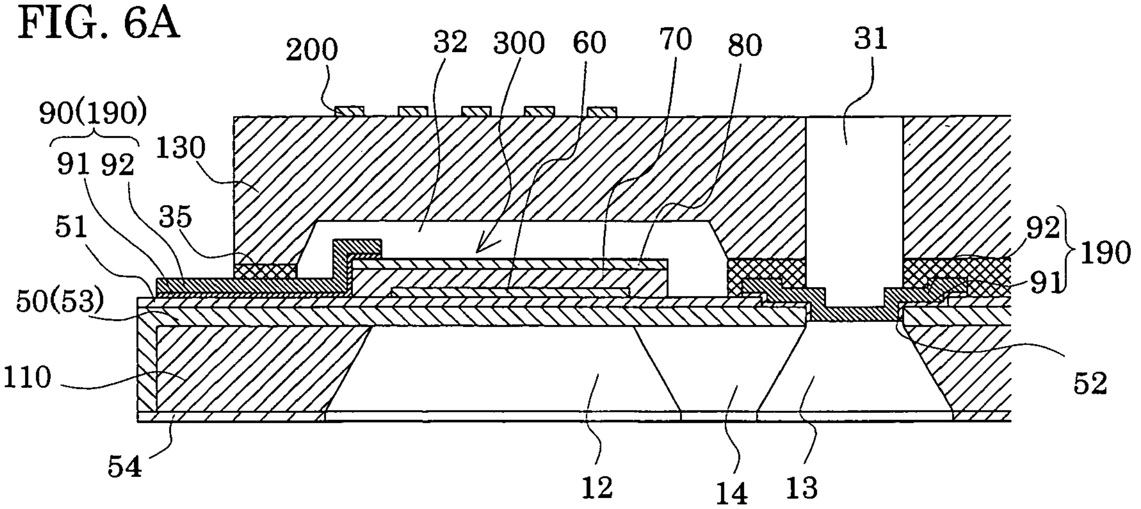
FIGS. 6A to 6C are cross-sectional views respectively showing steps of manufacturing the recording head according to Embodiment 1.

Subsequently, as shown in FIG. 6A, a part of the interconnect layer 190 in the penetrating portion 52 is removed by wet-etching (lightly-etching) the part of the interconnect layer 190 from the side where the communicating portion 13 is located. In other words, a part of the adhesion layer 91, which is exposed to the communicating portion 13, and a part of the metal layer 92, into which the adhesion layer 91 is diffused, are removed by etching. Accordingly, this makes weaker adhesion between the interconnect layer 190 and a protection film 15 which will be formed on the interconnect layer 190 in an ensuing step. As a result, the protection film 15 on the interconnect layer 190 can be easily detached from the interconnect layer 190.

Figure 6B:
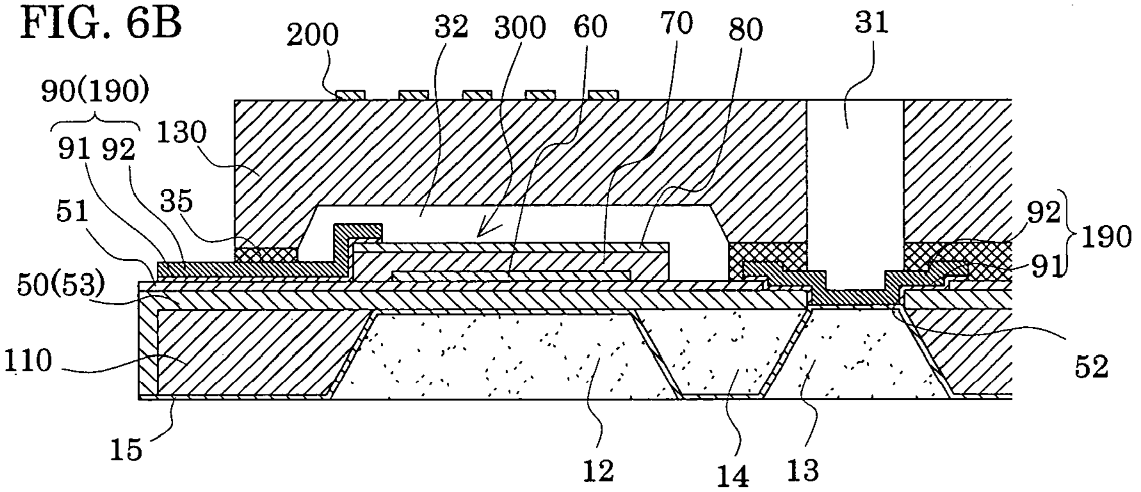

Thereafter, the mask film 54 on the surface of the resultant wafer for a passage-forming substrate 110 is removed from the surface. Then, as shown in FIG. 6B, the protection film 15 is formed by means of the CVD method or the like. The protection film 15 is made, for example, of a material which is an oxide, a nitride or the like, and which has resistance to the liquid (resistance to ink). In the case of this embodiment, the protection film 15 is made of tantalum pentoxide. At this time, since the penetrating portion 52 is sealed up with the interconnect layer 190, no protection film 15 is formed on the external surface and the like of the wafer for a reservoir forming plate 130 through the penetrating portion 52. As a result, no protection film 15 is formed on the surface of the wafer for a reservoir forming plate 130, on which surface the connecting wirings 200 and the like are formed. Accordingly, this makes it possible to prevent occurrence of defective connection in the driver IC 210 and the like. Concurrently, this makes unnecessary a step of removing an excessive part of the protection film 15. Consequently, this makes it possible to simplify the manufacturing steps, and to cut back on manufacturing costs.

Figure 6C:
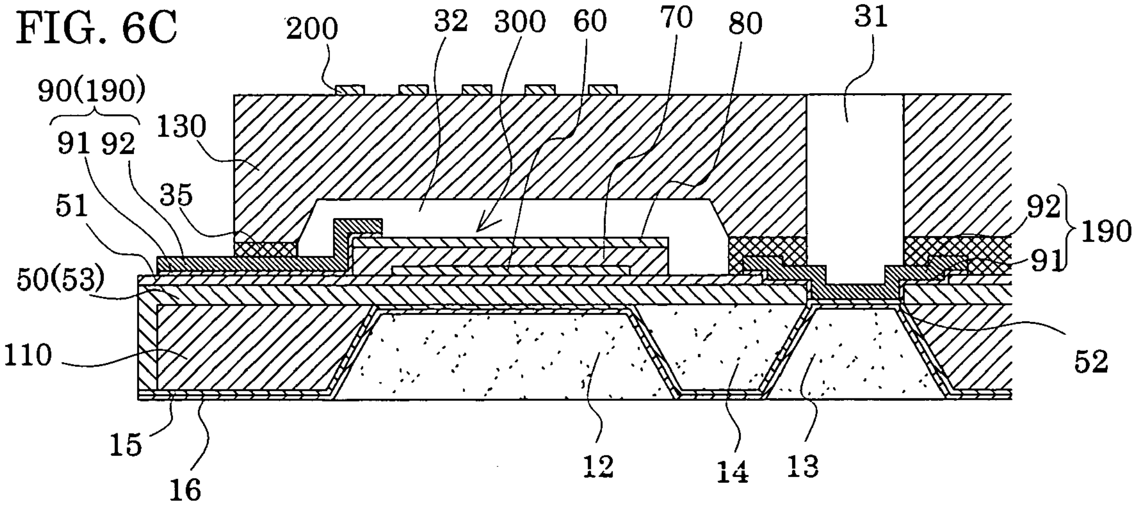

Then, as shown in FIG. 6C, a detachment layer 16 made of a material having high stress is formed on the protection film 15, for example, by the CVD method. It is desirable that, with regard to the detachment layer 16, the internal stress be a compressional stress. In particular, it is desirable that the internal stress be a compressional stress which is higher than 80 MPa. Furthermore, it is desirable that a material which makes adhesion between the detachment layer 16 and the protection film 15 stronger than adhesion between the protection film 15 and the interconnect layer 190 be used as the material for the detachment layer 16. In the case of this embodiment, the compound containing titanium and tungsten (TiW) is used as a material for the detachment layer 16.

Figure 7A:
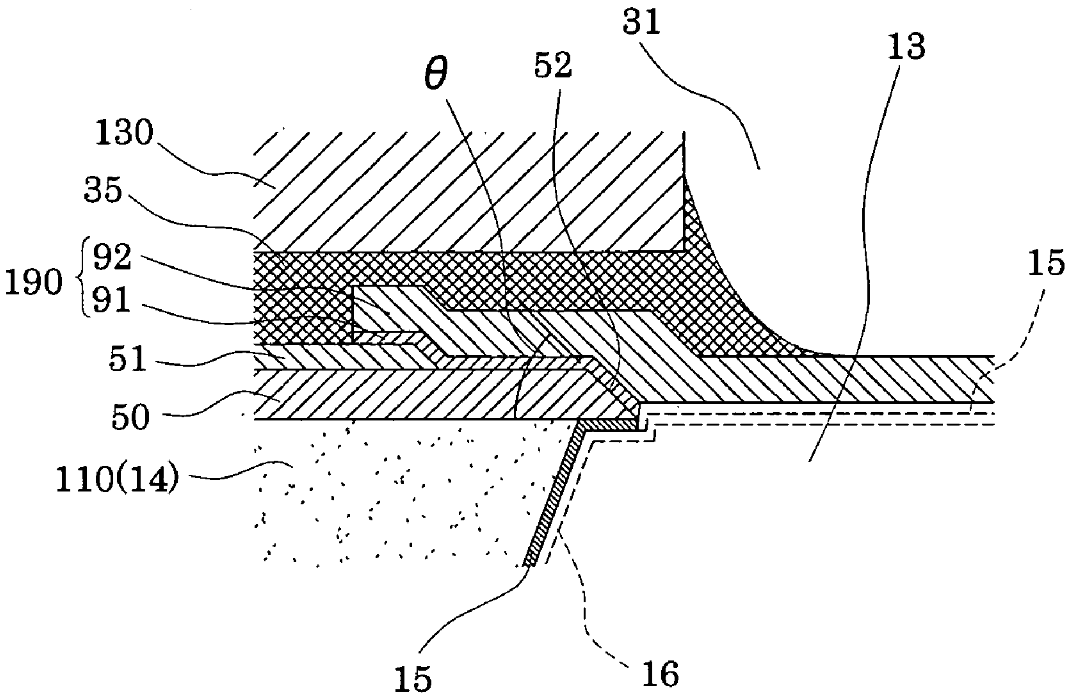
FIGS. 7A and 7B are expanded cross-sectional views respectively showing steps of manufacturing the recording head according to Embodiment 1.

In a case where the detachment layer 16 which is made of a high-stress material, and which has stronger adhesion to the protection film 15, is formed on the protection film 15 in the aforementioned manner, the protection film 15 formed on the interconnect layer 190 starts to come off from the interconnect layer 190 due to stress of the detachment layer 16. Subsequently, as shown in FIG. 7A, this detachment layer 16 is removed by wet-etching. Thereby, the protection film 15 on the interconnect layer 190 is completely removed along with the detachment layer 16. Incidentally, in the case of this embodiment, the part of the interconnect layer 190 provided to the penetrating portion 52, which part is close to the communicating portion 13, is removed in the aforementioned step. In other words, the part of the adhesion layer 91 and the part of the metal layer 92, into which the adhesion layer 91 has been diffused, are removed in the aforementioned step. As a result, the adhesion between the interconnect layer 190 and the protection film 15 is weaker. Accordingly, this makes it possible to easily detach the protection film 15 from the interconnect layer 190.

Figure 8:
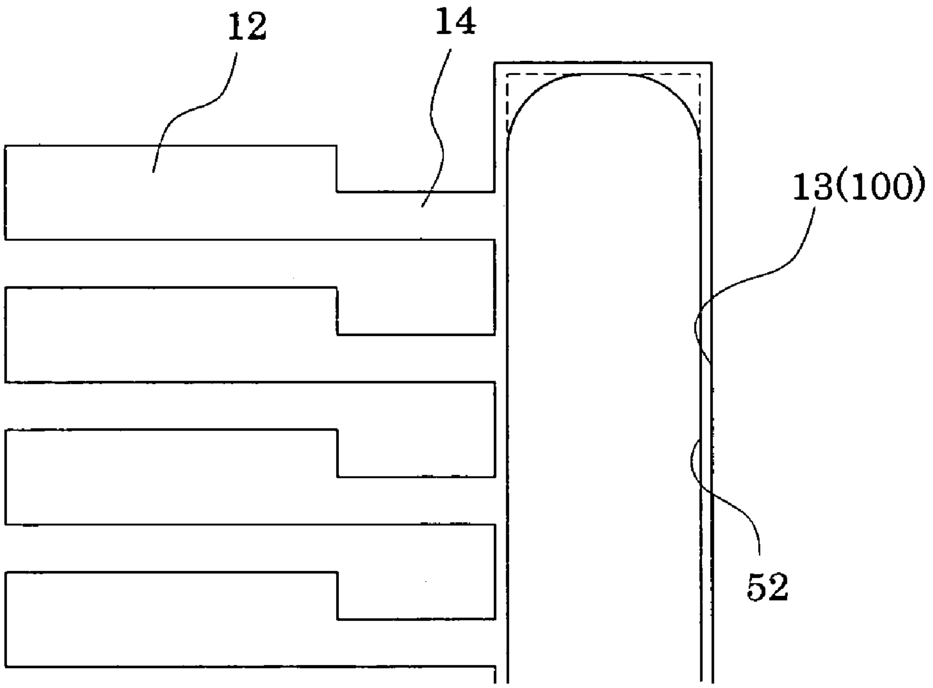
FIG. 8 is a schematic diagram for describing a shape of an opening of a penetrating portion.

In this regard, in the case of the present invention, the communication portion 13 is formed in a way that the edge of the opening, which is close to the vibration plate (elastic film 50), is located outside the edge of the opening of the penetrating portion 52. In addition, the edge of the opening of the penetrating portion 52, which edge is close to the wafer for a passage-forming substrate 110, is designed to be configured of only one of the vibration plate (the elastic film 50 and the insulation film 51) and the interconnect layer 190. In other words, the edge of the opening, which is close to the wafer for a passage-forming substrate 110, is designed to be configured of only one of the oxide and the thin metal film. In the case of this embodiment, for example, the edge of the opening of the communicating portion 13 is designed to be substantially configured of only the elastic film 50. As a result, while the protection film 15 formed on the inner surface of the communicating portion 13 and the like is being detached and removed along with the detachment layer 16, the protection film 15 is satisfactorily detached along the edge of the opening of this communicating portion 13. Only the protection film 15 on the interconnect layer 190 is reliably detached and removed therefrom. Consequently, what is termed as detachment residue is hardly produced. Accordingly, this makes it possible to reliably prevent this detachment residue from clogging the nozzles and causing similar things Moreover, for the purpose of satisfactorily detaching the protection film 15 on the interconnect layer 190, it is desirable that the angle θ between the inner surface of the penetrating portion 52 (the end face of the elastic film 50) and the surface of the vibration plate (the surface of the elastic film 50) be an acute angle of approximately 10 to 90 degrees (see FIG. 7A). Furthermore, it is desirable that the penetrating portion 52 be formed in a shape which causes the opening to have no angled part along the peripheral part. In a case where, as shown in FIG. 8, for example, the penetrating portion 52 is formed in a shape which causes the opening to be almost rectangular, it is desirable that all of the four corners of the opening be round shaped. Formation of the four corners of the opening in the round shape makes it possible to more satisfactorily and reliably detach the protection film 15 on the interconnect layer 190 along with the detachment layer 16.

Figure 7B:
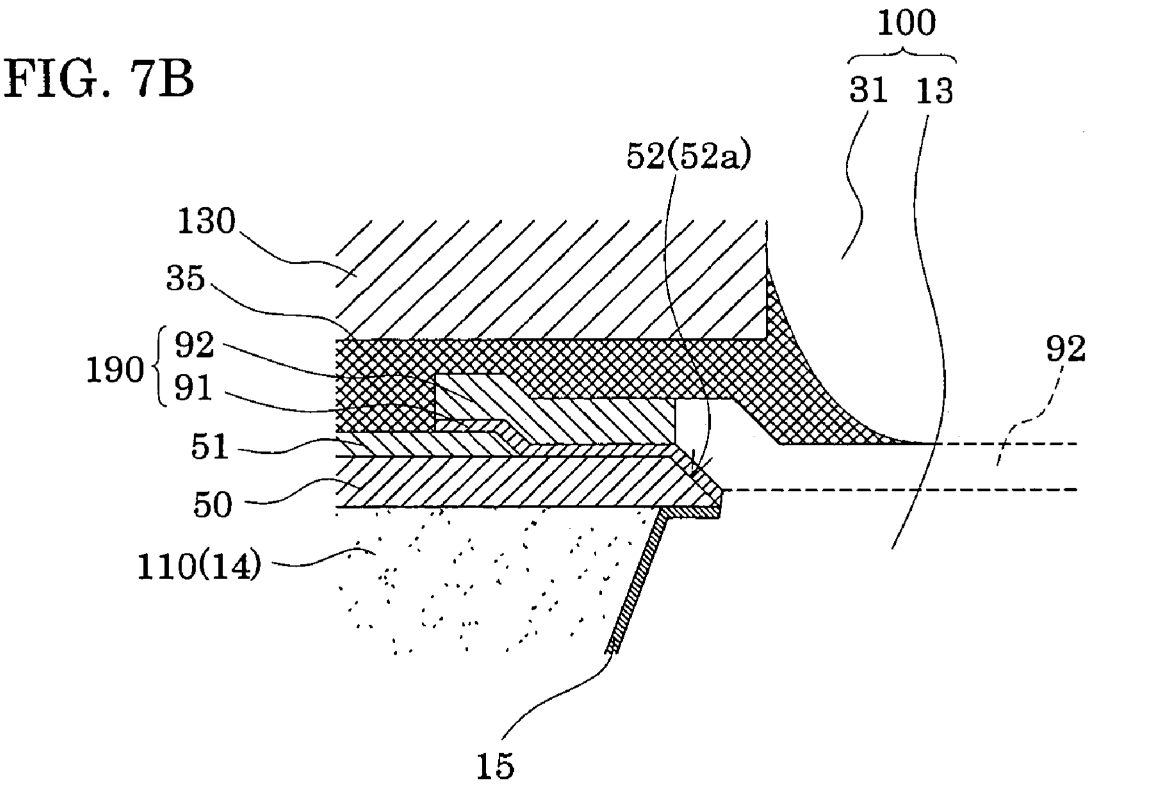

It should be noted that, after the protection film 15 on the interconnect layer 190 is removed in the aforementioned manner, as shown in FIG. 7B, the interconnect layer 190 is removed by wet-etching the interconnect layer 190 from the side where the communicating portion 13 is located, and thus the penetrating portion 52 is opened. At this time, the protection film 15 does not hinder the interconnect layer 190 from being wet-etched. This is because the protection film 15 is no longer formed on the interconnect layer 190.

As a result, the interconnect layer 190 can be removed easily and reliably by wet-etching, and thus the penetrating portion 52 can be opened. In other words, in the case of the manufacturing method according to the present invention, no extraneous matter, such as scraps, is produced, unlike the conventional mechanical process. Accordingly, this makes it possible to prevent scraps from remaining in the ink passages, such as the pressure generating chambers 12 and the communicating portion 13, and to reliably prevent failure in ejection, such as the clogging of the nozzles by remaining scraps, which would otherwise occur.

In addition, while the penetrating portion 52 is being formed by etching, it is desirable that only the metal layer 92 be removed without removing the adhesion layer 91 constituting the interconnect layer 190. In other words, it is desirable that the adhesion layer 91 is formed continuously from the peripheral part around the opening of the communicating portion 13 to the inner peripheral surface 52*a* of the penetrating portion 52. By this, the surface of an area of the elastic film 50, which area corresponds to the reservoir 100, is being completely covered with the adhesion layer 91 and the protection film 15. In other words, the surface of the elastic film 50 which is a part of the vibration plate is not exposed to the inside of the reservoir 100 by removing only the metal layer 92 constituting the interconnect layer 190. Accordingly, this makes it possible to more reliably prevent scraps from being produced.

Moreover, this embodiment brings about an effect that resistance to ink which the inner surface of the reservoir 100 has can be improved further. In the case of this embodiment, for example, the elastic film 50 is made of silicon dioxide, and its resistance to ink is relatively high. However, by designing the surface of the elastic film 50 not to be exposed to the inside of the reservoir 100 in the aforementioned-manner, the resistance to ink of the inner surface of the reservoir 100 becomes higher.

Subsequently, the driver IC 210 is packaged on the connecting wirings 200 which have been formed on the wafer for a reservoir forming plate 130, and the driver IC 210 and the lead electrodes 90 are connected with each other by use of the driver wirings 220 (see FIG. 2). Thereafter, unnecessary outer-peripheral parts of the wafer for a passage-forming substrate 110 and the wafer for a reservoir forming plate 130 are cut away and removed, for example, by a dicing process or the like. Then, the nozzle plate 20 is joined to a surface of the wafer for a passage-forming substrate 110, which surface is opposite a surface close to the wafer for a reservoir forming plate 130. The nozzle orifices 21 have been pierced in the nozzle plate 20. In addition, the compliance plate 40 is joined to the wafer for a reservoir forming plate 130. After that, the resultant wafer for a passage-forming substrate 110 and the like is divided into chip-sized sets each consisting of the passage-forming substrate 10 and the like as shown in FIG. 1. Thereby, inkjet recording heads each having the aforementioned configuration are manufactured.

As described above, in the case of the manufacturing method according to this embodiment, extraneous matter such as scraps is not produced, unlike the conventional mechanical process. Accordingly, this makes it possible to prevent scraps from remaining in the ink passages including the pressure generating chambers 12 and the communicating portion 13, and to reliably prevent occurrence of failure in ejection, such as the clogging of the nozzles by scraps remaining there.

Other Embodiments

The embodiment of the present invention has been described above. However, the present invention is not limited to the aforementioned embodiment. For example, in the case of the aforementioned embodiment, the interconnect layer 190 configured of the adhesion layer 91 and the metal layer 92 has been illustrated. However, the configuration of the interconnect layer 190 is not limited to this illustrated example. It does not matter whether, for example, the interconnect layer is configured of only the metal layer. In addition, in the case of the aforementioned embodiment, the protection film 15 on the interconnect layer 190 which has been formed in the penetrating portion 52 is designed to be removed by use of the detachment layer 16 made of the high-stress material. However, no specific restriction is imposed on the method of removing the protection film 15 on the interconnect layer 190.

Moreover, the present invention is intended to be widely applied to the entire range of liquid-jet heads, although the aforementioned embodiment has been described giving the inkjet recording head as an example of the liquid-jet head. It goes without saying that the present invention can be applied to a method of manufacturing any liquid-jet head which ejects a liquid other than ink. Examples of a liquid-jet head which ejects a liquid other than ink include: various recording heads used for image recording apparatuses such as printers; color-material-jet heads used for manufacturing color filters of liquid crystal display devices and the like; electrode-material-jet heads used for forming electrodes of organic EL display devices, FED (Field Emission Display) devices and the like; and bio-organic-substance-jet heads used for manufacturing bio-chips.

What is claimed is:

1. A method of manufacturing a liquid-jet head, comprising the steps of:

forming piezoelectric elements, each of which includes a lower electrode, a piezoelectric layer and an upper electrode, on a side of a passage-forming substrate with a vibration plate between the group of the piezoelectric elements and the passage-forming substrate, in which passage-forming substrate liquid passages including pressure generating chambers and a communicating portion are formed, the pressure generating chambers communicating respectively with nozzle orifices from which to eject a liquid, and the communicating portion communicating with the pressure-generating chambers; and forming a penetrating portion by removing an area in the vibration plate which serves as the communicating portion;

forming lead electrodes drawn out respectively from the piezoelectric elements, and sealing up the penetrating portion with an interconnect layer which is separated from the lead electrodes;

joining a reservoir forming plate, in which a reservoir portion is formed, to the side of the passage-forming substrate, the reservoir portion communicating with the communicating portion, and constituting a part of a reservoir;

forming liquid passages by wet-etching the passage-forming substrate from the other side thereof until the vibration plate and the interconnect layer are exposed;

forming a protection film, which is made of a material having resistance to a liquid, on an inner surface of each of the liquid passages formed in the passage-forming substrate;

detaching and removing the protection film on the interconnect layer; and removing part of the interconnect layer by wet-etching the part of the interconnect layer from a side at which the communicating portion is located, and thereby causing the reservoir portion and the communicating portion to communicate with each other, wherein, while the passage-forming substrate is being formed, the communicating portion is formed in a way that an edge of an opening of the communicating portion, which opening is close to the vibration plate is located outside an edge of an opening of the penetrating portion, and thereby at least the edge of the opening of the penetrating portion, which opening is close to the passage-forming substrate, is configured of only one of the vibration plate and the interconnect layer.

2. The method of manufacturing a liquid-jet head according to claim 1, wherein the penetrating portion is formed with a shape causing the opening to have no angled part throughout the peripheral part.

3. The method of manufacturing a liquid-jet head according to claim 1, wherein the penetrating portion is formed in a way that an angle between the inner surface of the penetrating portion and a surface of the vibration plate, which surface is close to the passage-forming substrate, is an acute angle.

4. The method of manufacturing a liquid-jet head according to claim 1, wherein, in the protection film detaching step, a detachment layer whose internal stress is a compressional stress is formed on the protection film, and thereafter the protection film is detached along with the detachment layer by detaching the detachment layer.

5. The method of manufacturing a liquid-jet head according to claim 4, wherein the internal stress of the detachment layer is not smaller than 80 Mpa.

6. The method of manufacturing a liquid-jet head according to claim 4, wherein adhesion between the detachment layer and the protection film is stronger than adhesion between the protection film and the interconnect layer.

7. The method of manufacturing a liquid-jet head according to claim 4, wherein titanium-tungsten (TiW) is used as a material for the detachment layer.

8. The method of manufacturing a liquid-jet head according to claim 1, further comprising a step of removing a part of the interconnect layer in the thickness direction, which part is exposed to the inside of the communicating portion, prior to the protection film forming step.

9. The method of manufacturing a liquid-jet head according to claim 8, wherein the interconnect layer includes an adhesion layer and a metal layer formed on the adhesion layer, and wherein, in the step of removing the part of the interconnect layer in the thickness direction, a surface of the interconnect layer is lightly etched, and thus at least the adhesion layer is removed.

10. The method of manufacturing a liquid-jet head according to claim 9, wherein, in the step of causing the reservoir portion and the communicating portion to communicate with each other, only the metal layer in the interconnect layer is removed.

11. The method of manufacturing a liquid-jet head according to claim 1, wherein any one of an oxide and a nitride is used as a material for the protection film.

12. The method of manufacturing a liquid-jet head according to claim 11, wherein tantalum oxide is used as a material for the protection film.

* * * * *